United States Patent
Kudoh

(10) Patent No.: US 7,638,930 B1
(45) Date of Patent: Dec. 29, 2009

(54) ELECTRICALLY CONDUCTIVE POLYMER ACTUATOR AND METHOD FOR MANUFACTURING THE SAME

(75) Inventor: Yuji Kudoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/362,946

(22) Filed: Jan. 30, 2009

Related U.S. Application Data

(63) Continuation of application No. PCT/JP2008/001485, filed on Jun. 11, 2008.

(51) Int. Cl.
*H01L 41/00* (2006.01)
*C25B 13/00* (2006.01)

(52) U.S. Cl. .................. 310/328; 310/800; 204/282

(58) Field of Classification Search .......... None
See application file for complete search history.

(56) References Cited

U.S. PATENT DOCUMENTS

| 2006/0057451 A1 | 3/2006 | Okuzaki et al. |
| 2006/0266981 A1 | 11/2006 | Asaka et al. |

FOREIGN PATENT DOCUMENTS

| EP | 0 924 033 A2 | 6/1999 |
| JP | 11-169394 | 6/1999 |
| JP | 11-206162 | 7/1999 |
| JP | 2005-111245 | 4/2005 |
| JP | 2005-145987 | 6/2005 |
| JP | 2005-176428 | 6/2005 |
| JP | 2006-050780 | 2/2006 |
| JP | 2006-129541 | 5/2006 |
| JP | 2008-011593 | 1/2008 |

OTHER PUBLICATIONS

Pelrine, et al., "High-Speed Electrically Actuated Elastomers with Strain Greater Than 100%," Science, vol. 287, Feb. 4, 2000, pp. 836-839.
Ohno, Hiroyuki edit., "Ionic Liquids: The Front and Future of Material Development," CMC Publishing CO., LTD., pp. 171-181.

*Primary Examiner*—Dah-Wei D Yuan
*Assistant Examiner*—Maria J Laios
(74) *Attorney, Agent, or Firm*—McDermott Will & Emery LLP

(57) ABSTRACT

To improve adhesive properties between an electrically conductive polymer membrane and a solid electrolyte membrane to each other, and thus to ensure the operation of an electrically conductive polymer actuator which effects a bending motion is aimed.

The bendable electrically conductive polymer actuator of the present invention is an electrically conductive polymer actuator having a laminating structure of: a first organic polymer including at least one or more of a vinylidene fluoride/hexafluoropropylene copolymer, polyvinylidene fluoride, a perfluorosulfonic acid/polytetrafluoroethylene copolymer, polymethyl methacrylate, polyethylene oxide, and polyacrylonitrile; a solid electrolyte membrane including a mixture with an ionic liquid; and an electrically conductive polymer membrane including a mixture of polyethylenedioxythiophene and polystyrene sulfonic acid on at least one face of the solid electrolyte membrane, in which a second organic polymer including polyvinylphenol is embedded in the electrically conductive polymer membrane surface in the state being dispersed.

6 Claims, 2 Drawing Sheets

ELECTRICALLY CONDUCTIVE POLYMER ACTUATOR AND METHOD FOR MANUFACTURING THE SAME

This application is a continuation of International Application No. PCT/JP2008/001485, whose international filing date is Jun. 11, 2008 the disclosure of which Application is incorporated by reference herein.

BACKGROUND OF THE INVENTION

1. Field of the Invention

The present invention relates to an electrically conductive polymer actuator which can be applied to robots for household use and the like, and a method for manufacturing the same. In particular, the present invention relates to an actuator in which an electrochemical reaction is utilized, and a method for manufacturing the same.

2. Related Art

In recent years, necessity for actuators which are compact, light weight, and highly flexible has been increasing in the field of robots for household use and medical care, because properties similar to human muscle (for example, safety which can avoid causing injury upon contact, softness not causing pain even upon bumping) are demanded on actuators for operating robots expected to participate actively in close proximity to human bodies in supporting domestic duties and jobs at home, offices, hospitals etc., as well as in supporting for nursing of elderly persons and handicapped persons, and the like.

As compact and light weight actuators, those of electrostatic attraction type, piezoelectric type, ultrasonic type, and, shape memory alloy type and the like have been already put into practical applications. These actuators cannot be highly flexible actuators since an inorganic material is used, and due to their motion principles. Thus, attempts to provide a light weight and highly flexible actuator by using an organic material such as a polymer have been made in various fields extensively in recent years.

For example, one in which a gel is allowed to bend by an electric voltage (Japanese Unexamined Patent Application, First Publication No. Hei 11-206162/Patent Document 1), one in which a high electric voltage is applied between dielectric elastomer thin films to permit deformation (R. Pelrine, R. Kornbluh, Q. Pei and J. Joseph: Science, 287, 836-839 (2000)/Nonpatent Document 1), one in which expansion and contraction of an electrically conductive polymer is allowed by an oxidative-reductive reaction (Japanese Unexamined Patent Application, First Publication No. 2006-050780/Patent Document 2), and the like may be exemplified.

Since the actuator of such a type in which a gel is allowed to bend by an electric voltage cannot maintain the bendability unless application of the electric voltage is kept due to small initiation stress, a problem of increase in the electric power consumption may be raised. In addition, when a dielectric elastomer thin film must be used, high voltage of several hundred to several kilo volts is required for the deformation. Thus, when such actuators are used in robots for household use, a problem of the risk such as electric shock may be raised because of excessively high voltage. To the contrary, the electrically conductive polymer actuator in which expansion and contraction of an electrically conductive polymer accompanied with an oxidative reaction is utilized has a comparatively simple structure, is easy in miniaturization and weight saving, and highly flexible. Furthermore, such an actuator can be driven at a voltage as low as several volts, and is also characterized by sufficiently high initiation stress.

A bendable actuator in which expansion and contraction of an electrically conductive polymer is utilized has a structure including an electrically conductive polymer membrane laminated on at least one face of a solid electrolyte membrane, as shown in FIG. 2. In FIG. 2, 301 designates an actuator element, 302a and 302b designate an electrically conductive polymer membrane, 303 designates a solid electrolyte membrane, and 304a and 304b designate an electrode. When the electrically conductive polymer membrane is laminated on only one face of the solid electrolyte membrane, a metal electrode thin film (counter electrode) is formed on another face of the solid electrolyte membrane for applying a voltage. In some cases, a metal electrode thin film may be formed on the electrically conductive polymer membrane for applying a voltage. Further, by applying a predetermined voltage between the electrically conductive polymer membrane and the counter electrode, or between the electrically conductive polymer membranes, bending of the laminated film is caused. The motion principle of the bending has been believed as in the following. That is, the applied voltage allows the electrically conductive polymer to be oxidatively reacted, and concomitantly, ions are incorporated into the electrically conductive polymer membrane, or taken out therefrom. The volume of the electrically conductive polymer membrane is altered in response to such in-and-out migration of the ion, and thus the actuator is bent since the solid electrolyte membrane accompanied by no change in the volume is laminated. For example, in the construction shown in FIG. 2, the actuator is bent in a downward direction when the ion is incorporated into the upside electrically conductive polymer membrane, or when the ion is taken out from the downside electrically conductive polymer membrane. To the contrary, the actuator is bent in an upward direction when the ion is taken out from the upside electrically conductive polymer membrane, or when the ion is incorporated into the downside electrically conductive polymer membrane.

Examples of the electrically conductive polymer used in an actuator include polyaniline, polypyrrole, polythiophene, and derivatives thereof (Patent Document 2).

The electrically conductive polymer actuator utilizes the in-and-out migration of the ion to and from the electrically conductive polymer membrane, which is caused concomitant with an electrical oxidation and reduction of the electrically conductive polymer, according to the motion principle. Therefore, an electrolyte is required as an ion supply source for executing motion, and a solid electrolyte having a sufficient ionic conductivity at a temperature around the room temperature is required for permitting operation in the air. In this regard, a material termed "ion gel" has been produced recently. It is a material prepared by gelatinizing at least either one of a polymer or a monomer dispersed in an ionic liquid, and allowing the ionic liquid to be retained in the three-dimensional network structure of the gel. Thus, it has flexibility, and achieves a value of $10^{-2}$ S/cm at room temperature, which is 100 times or higher than that of conventional polyether type polymer solid electrolytes (Ionic Liquid—Forefront of Development and Future—2003, Hiroyuki Ohno, edit., CMC Publishing CO., LTD./Nonpatent Document 2).

In addition, as documents which can be relevant to the present invention, Japanese Unexamined Patent Application, First Publication No. 2006-129541 (Patent Document 3) and Japanese Unexamined Patent Application, First Publication No. 2005-145987 (Patent Document 4) may be referred to.

Patent Document 3 discloses a polymer actuator device. In FIG. 9 and its description discloses a polymer actuator device which includes regulation electrode A (reference number: 203), electrolytic displacement part A formed with an electrically conductive polymer (reference number: 201), electrolyte part (reference number: 202), electrolytic displacement part B formed with an electrically conductive polymer (reference number: 201'), and regulation electrode B (reference number: 203').

Moreover, it is described that polythiophene is preferred as the electrically conductive polymer in paragraph number 0077 of Patent Document 3. The paragraph number 0078 of Patent Document 3 discloses that a fluorine based polymer such as polyvinylidene fluoride, and the copolymer thereof may be used as the polymer solid electrolyte. Furthermore, it is disclosed that sulfonic acid may be introduced into its basic skeleton.

Patent Document 4 discloses an electrically conductive polymer gel and a method for producing the same, an actuator, a patch label for introducing an ion, and a bioelectrode. In addition, Patent Document 4, paragraph number 0069 (Example 7) discloses addition of an alcohol to a poly(3,4-ethylenedioxythiophene)-poly(ethylenesulfonate) colloid dispersion liquid (abbreviated as PEDOT/PSS).

SUMMARY OF THE INVENTION

In conventional electrically conductive polymer actuators, polyaniline, polypyrrole, polythiophene and derivatives thereof have been used as electrically conductive polymers, however, just low adhesive properties are provided to each other between such an electrically conductive polymer membrane and a solid electrolyte membrane formed with an ion gel. Therefore, when an electrically conductive polymer membrane and a solid electrolyte membrane formed with an ion gel are laminated to form a bendable actuator, a problem of detachment of the electrically conductive polymer membrane from the solid electrolyte membrane formed with the ion gel has been raised in operation of the actuator.

An object of the present invention is to provide a bendable electrically conductive polymer actuator which is not accompanied by deterioration even though it is repeatedly operated, through improving adhesive properties between an electrically conductive polymer membrane and a solid electrolyte membrane formed with an ion gel to each other. Another object of the invention is to provide a method of manufacture for achieving this actuator.

The bendable electrically conductive polymer actuator according to the present invention which can solve the foregoing problems includes
a pair of electrodes, and
a laminating structure sandwiched between the pair of electrodes, wherein
the laminating structure includes:
a solid electrolyte membrane constituted with a mixture including an ionic liquid, and a first organic polymer that contains at least one or more of a vinylidene fluoride/hexafluoropropylene copolymer [P(VDF/HFP)], polyvinylidene fluoride (PVDF), a perfluorosulfonic acid/polytetrafluoroethylene (PTFE) copolymer, polymethyl methacrylate (PMMA), polyethylene oxide (PEO) and polyacrylonitrile (PAN); and
an electrically conductive polymer membrane which is formed on the solid electrolyte membrane, and which is constituted with a mixture of polystyrene sulfonic acid (PSS) and polyethylenedioxythiophene (PEDOT) formed on at least one face of the solid electrolyte membrane, and wherein
a second organic polymer constituted with polyvinylphenol (PVP) is embedded in the state being dispersed, in the electrically conductive polymer membrane surface, and
the solid electrolyte membrane is in contact with the face of the electrically conductive polymer membrane surface in which the second organic polymer is embedded in the state being dispersed.

The method of driving the bendable electrically conductive polymer actuator according to the present invention as described above includes the steps of:

providing the bendable electrically conductive polymer actuator, and
applying a voltage to the pair of electrodes.
It is preferred that the electrically conductive polymer membrane be formed on both faces of the solid electrolyte membrane.

The first method for manufacturing the bendable electrically conductive polymer actuator according to the present invention as described above includes the steps of:
coating a dispersion liquid or solution of an electrically conductive polymer on a substrate, and before the dispersion liquid or solution is dried to form a solid film, embedding a second organic polymer constituted with polyvinylphenol (PVP) in the state being dispersed, by means of spraying or coating; and
laminating on at least one face of the solid electrolyte membrane so as to be opposed to the face of the electrically conductive polymer membrane surface in which the second organic polymer is embedded in the state being dispersed.

The second method for manufacturing the bendable electrically conductive polymer actuator according to the present invention as described above includes the steps of:
embedding a second organic polymer in the state being dispersed, in an electrically conductive polymer membrane surface by dispersing the second organic polymer, which is constituted with polyvinylphenol (PVP), and which has a specific gravity smaller than that of the electrically conductive polymer dispersion liquid or solution, in the electrically conductive polymer dispersion liquid or solution beforehand; and
laminating on at least one face of the solid electrolyte membrane so as to be opposed to the face of the electrically conductive polymer membrane surface in which the second organic polymer is embedded in the state being dispersed.

The foregoing objects, other objects, features and advantages of the present invention will be clarified from the following detailed description of preferred embodiments with reference to accompanying drawings.

According to the present invention, an electrically conductive polymer actuator which effects a bending motion and is not accompanied by deterioration of the characteristics even though it is repeatedly operated, and in which adhesive properties between an electrically conductive polymer membrane and a solid electrolyte membrane formed with an ion gel can be improved.

DESCRIPTION OF REFERENCE NUMERALS AND SIGNS

Detailed Description of the Invention

Figure 1:
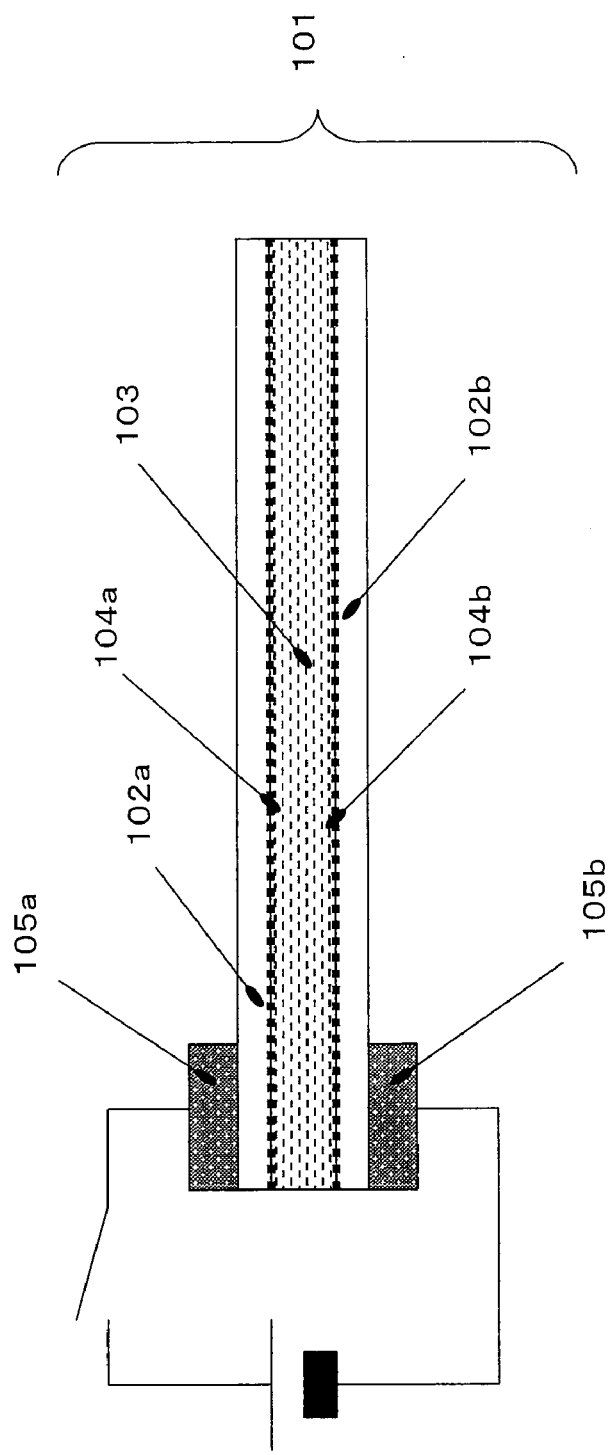
FIG. 1 shows a schematic view illustrating an actuator of one embodiment according to the present invention.
Figure 2:
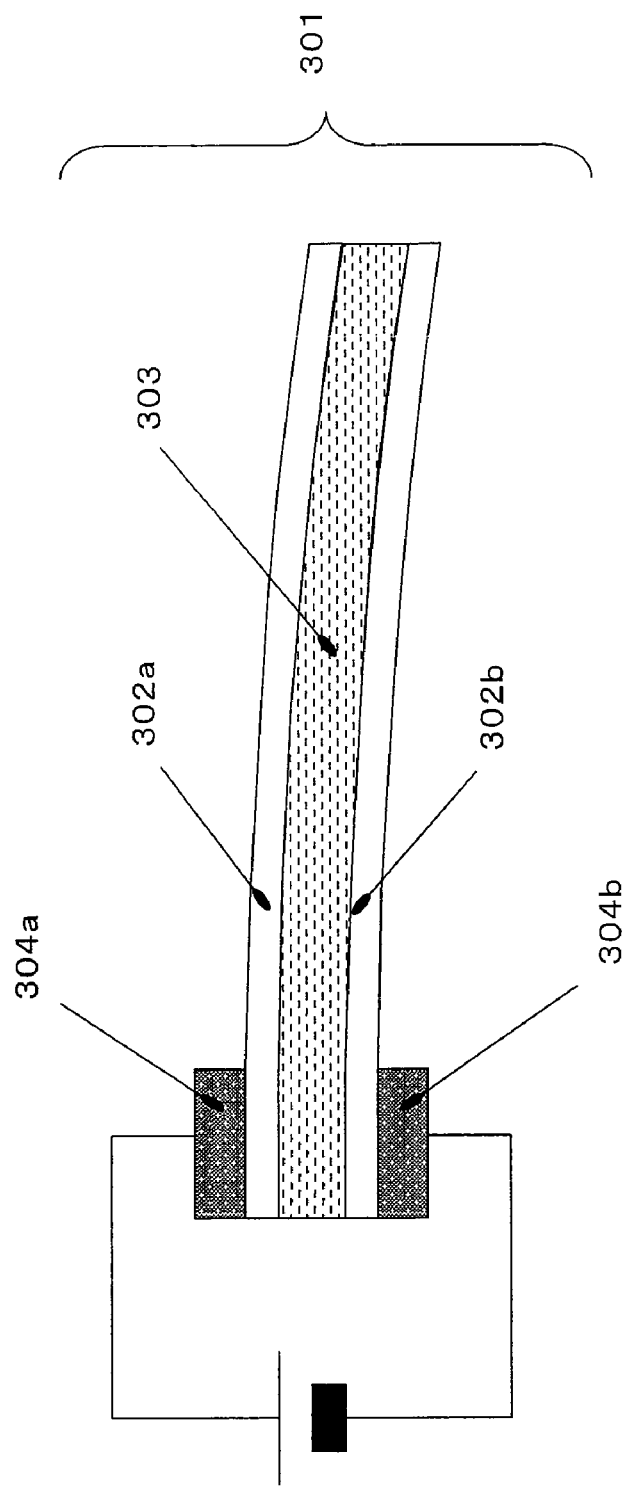
FIG. 2 shows a schematic view illustrating a conventional bendable actuator.

Hereinafter, the mode for carrying out the present invention is explained with reference to the drawings.
FIG. 1 shows a schematic cross-sectional view illustrating an actuator of one embodiment according to the present invention. Actuator 101 is constituted with a laminate of electrically conductive polymer membranes 102a and 102b, and solid electrolyte membrane 103, in which electrodes 105a and 105b are provided so as to sandwich one ends of the electrically conductive polymer membranes 102a and 102b, respectively. By applying a voltage of several volts between the electrode 105a and the electrode 105b, the actuator 101 effects a bending motion with the part sandwiched by the electrodes 105*a* and 105*b* which serves as a fixed part. Similar bending motion is effected even with a structure in which an electrically conductive polymer membrane is laminated on one face of a solid electrolyte membrane, and a metal electrode thin film (counter electrode) is formed on another face of the solid electrolyte membrane for applying a voltage. However, by laminating an electrically conductive polymer membrane on both faces of a solid electrolyte membrane, a greater bending displacement can be achieved.

The electrically conductive polymer which may be used in the present invention has a conjugate double bond, whereby the p electrons are spread through the entire polymer to contribute to electronic conductivity. The electric conduction by an electrically conductive polymer has been believed to be caused via polaron and bipolaron, which are generated upon interaction of an oxidizing agent doped in the polymer and p electrons in the polymer, and serve as charging carriers. Although polyaniline, polypyrrole, polythiophene and derivatives thereof can be used as the electrically conductive polymer in the present invention, particularly, polyethylenedioxythiophene (PEDOT) is preferably included, and a mixture of polyethylenedioxythiophene (PEDOT) and polystyrene sulfonic acid (PSS) is more preferably used. In the case in which polyethylenedioxythiophene (PEDOT) is used, its monomer can be chemically polymerized beforehand, and thus an electrically conductive polymer membrane can be formed by merely coating a dispersion of this polymer on a substrate. Therefore, a polymer membrane having a uniform thickness can be readily obtained on a substrate having a great area by employing a spin coating, slit coating, bar coating, dipping or casting method. In addition, it is suited for mass production owing to simple process for production.

The polyethylenedioxythiophene (PEDOT) and polystyrene sulfonic acid (PSS) in the mixture that constitutes the electrically conductive polymer are represented by (chemical formula 1) and (chemical formula 2), respectively. Polyethylenedioxythiophene is characteristic in that it is less likely to be subjected to oxidative deterioration since the B-position of its chemically active five-membered ring is previously inactivated by modification with oxygen. Additionally, polystyrene sulfonic acid is strongly bound to polyethylenedioxythiophene via ionic bonds in the mixture.

According to the electrically conductive polymer membrane in which the second organic polymer constituted with polyvinylphenol (PVP) is embedded in the state being dispersed, in the surface, particles of the second organic polymer are embedded in the electrically conductive polymer membrane, and a part of them are exposed to the surface of the electrically conductive polymer membrane. The method for manufacturing this electrically conductive polymer membrane can be executed by a procedure in which an electrically conductive polymer dispersion liquid or solution is coated on a substrate, and before the dispersion liquid or solution is dried to form a solid film, the second organic polymer is embedded in the state being dispersed, by means of spraying or coating. Furthermore, since the second organic polymer constituted with polyvinylphenol (PVP) has a lower specific gravity than that of the electrically conductive polymer dispersion liquid or solution, the second organic polymer can be also embedded in the state being dispersed, in the electrically conductive polymer membrane surface, by dispersing the second organic polymer in the electrically conductive polymer dispersion liquid or solution beforehand. In order to embed the second organic polymer in the state being dispersed, in the surface as described above, it is necessary that the second organic polymer is insoluble in the solvent of the electrically conductive polymer dispersion liquid or solution. When the second organic polymer is dispersed in the electrically conductive polymer membrane surface after the electrically conductive polymer membrane formed a solid film, the second organic polymer cannot be embedded in the electrically conductive polymer membrane. Therefore, the effect of improving the adhesive properties between the electrically conductive polymer membrane and the solid electrolyte cannot be achieved.

Formation of the second organic polymer constituted with polyvinylphenol (PVP) as a continuous membrane on the electrically conductive polymer membrane surface is not preferred since the in-and-out migration of the ion to and from the electrolyte, which is a motion principle of the electrically conductive polymer actuator, is inhibited.

The amount of dispersion of the second organic polymer constituted with polyvinylphenol (PVP) is preferably from 0.05% by weight to 1% by weight in terms of mixing percentage of the second organic polymer with respect to the electrically conductive polymer dispersion liquid or solution (content of the electrically conductive polymer solid: 1% by weight). When the amount is below this range, the adhesive properties between the electrically conductive polymer and the ion gel cannot be achieved, whereby the bending motion

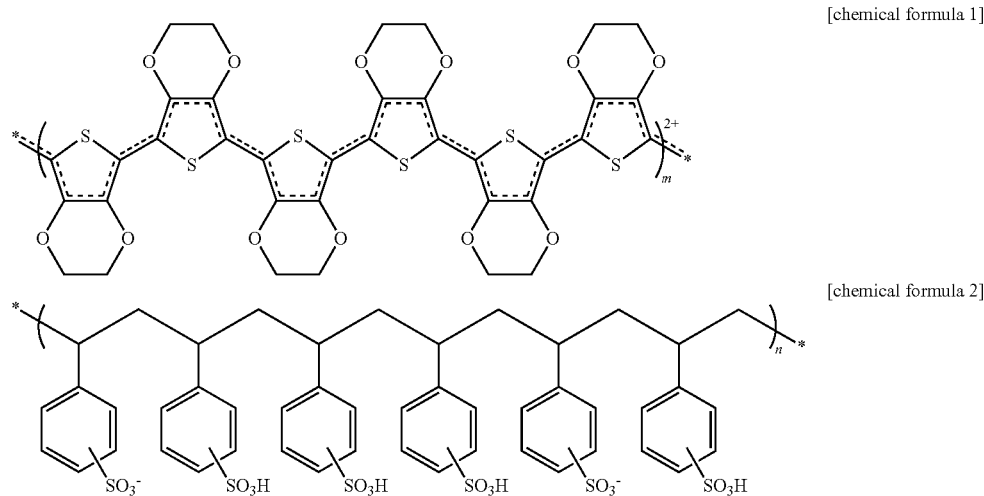

[chemical formula 1]

[chemical formula 2]

of the actuator produced therewith may be difficult. To the contrary, when the amount is above this range, to obtain the membrane form of the electrically conductive polymer may be difficult.

Although details of the mechanism which determine the adhesive force between the electrically conductive polymer membrane and the solid electrolyte membrane formed with an ion gel have not been well elucidated, it is speculated from a number of experiments conducted by the present inventors that the electrically conductive polymer membrane is adhered to the solid electrolyte membrane formed with an ion gel by an anchoring effect exhibited by the second organic polymer particles.

The solid electrolyte membrane 103 used in the present invention is a material termed "ion gel", which is prepared by gelatinizing at least either one of a polymer or a monomer dispersed in an ionic liquid, and allowing the ionic liquid to be retained in the three-dimensional network structure of the gel. Thus, it has flexibility, and achieves a value of $10^{-2}$ S/cm at room temperature, which is 100 times or higher than that of conventional polyether type polymer solid electrolytes. As the solid electrolyte membrane, the ion gel can be used alone, but the ion gel can be also used after impregnating in a porous membrane such as paper, membrane filter or the like.

The ionic liquid is also referred to as "ordinary temperature molten salt" or merely as "molten salt", which is a salt that exhibits a molten state in a wide temperature range including ordinary temperatures (room temperatures).

In the present invention, conventionally known various types of ionic liquids can be used, but those which exhibits a liquid state at ordinary temperatures (room temperatures) or at temperatures approximate to ordinary temperatures (room temperatures), and which are stable are preferred.

As the ionic liquid preferably used in the present invention, illustrative examples include those containing a cation represented by the following (chemical formula 3) to (chemical formula 6), and an anion ($X^-$).

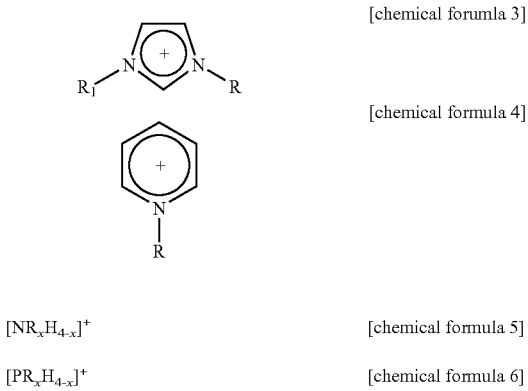

[chemical forumla 3]

[chemical formula 4]

$[NR_xH_{4-x}]^+$ [chemical formula 5]

$[PR_xH_{4-x}]^+$ [chemical formula 6]

In the above (chemical formula 3) to (chemical formula 6), R represents an alkyl group having 1 to 12 carbon atoms, or an alkyl group having an ether linkage and having 3 to 12 carbon and oxygen atoms in total number. In the (chemical formula 3), $R_1$ represents an alkyl group having 1 to 4 carbon atoms or a hydrogen atom. In the (chemical formula 3), R is preferably different from $R_1$. In the (chemical formula 5) and (chemical formula 6), x each represents an integer of from 1 to 4. In the present invention, an imidazolium ion represented by the (chemical formula 3) is more preferred.

As the anion ($X^-$), at least one selected from tetrafluoroboric acid anion, hexafluorophosphoric acid anion, bis(trifluoromethanesulfonyl)imidic acid anion, perchloric acid anion, tris(trifluoromethanesulfonyl)carbon acid anion, trifluoromethanesulfonic acid anion, dicyanamide anion, trifluoroacetic acid anion, organic carboxylic acid anion and halogen ion is preferred.

Examples of the organic polymer which can be used in obtaining a gelatinous composition to be employed as the ion gel include vinylidene fluoride/hexafluoropropylene copolymers [P(VDF/HFP)], polyvinylidene fluoride (PVDF), perfluorosulfonic acid/PTFE copolymers, polymethyl methacrylate (PMMA), polyethylene oxide (PEO), and polyacrylonitrile (PAN).

Alternatively, a gelatinous composition to be employed as the ion gel can be obtained also by dissolving a monomer (for example, methyl methacrylate, MMA), a crosslinking agent (for example, ethylene glycol dimethacrylate, EGDMA), and a polymerization initiator (for example, azobisisobutyronitrile, AIBN) in an ionic liquid, and permitting the polymerization reaction in the ionic liquid to form an organic polymer.

The solid electrolyte can be obtained by preparing an ion gel precursor by mixing the ionic liquid and at least one of the polymer or monomer described above, and heating the mixture followed by cooling. In light of the strength and ionic conductivity, the weight ratio in the case of the mixture including the ionic liquid and the organic polymer is preferably 9:1 to 6:4, and more preferably 8:2 to 7:3. Also, the molar ratio in the case of the mixture including the ionic liquid and the monomer is preferably 3:7 to 7:3, and more preferably 4:6 to 6:4.

The electrode is acceptable as long as it has electronic conductivity, and can readily accept and donate the electron from and to the electrically conductive polymer without causing a chemical reaction with the electrically conductive polymer. Examples of the electrode which can be used include metals such as gold, silver, platinum, copper and chromium, and carbon-containing plates.

Hereinafter, the actuator according to the present invention is explained in more detail by way of Examples, however, the present invention is not limited thereto.

Example 1

Production of Electrically Conductive Polymer Membrane in which Second Organic Polymer is Embedded in the State being Dispersed On a slide glass subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT with which 5% by weight of dimethyl sulfoxide (DMSO) and 0.5% by weight of polyvinylphenol (PVP) were mixed. Since the specific gravity of PVP is smaller than that of aqueous dispersion liquid of the mixture of PSS and PEDOT, PVP was raised to the upper part of the mixed liquid. Thereafter, the solvent was volatilized by air drying at a room temperature, whereby an electrically conductive polymer membrane was formed on the slide glass, in which PVP was embedded in the state being dispersed. Finally, the electrically conductive polymer membrane was detached from the slide glass using a razor. Thus obtained electrically conductive polymer membrane had a mean thickness of 19 μm, and had an electric conductivity of 205 S/cm as determined with a four-probe method.

Preparation of Material of Ion Gel

In the ionic liquid for producing the ion gel, ethylmethyl imidazolium (EMI) was used as a cation, while bis(trifluoromethanesulfonyl)imide [$(CF_3SO_2)_2N^-$] (TFSI) was used as an anion. As the polymer to be mixed, a polyvinylidene fluoride-hexafluoropropylene copolymer [P(VDF/HFP)] was used. The mixing ratio of EMITFSI to P(VDF/HFP) was 8:2 by weight ratio, and after mixing, the liquid was sufficiently stirred using a magnetic stirrer. Hereinafter, this mixed liquid is designated as ion gel precursor.

Production of Electrolyte Ion Gel

A polyethylene terephthalate (PET) sheet having a thickness of 0.1 mm was cut into a size of 76 mm×26 mm, and this piece was brought into close contact with a slide glass having a size of 76 mm×26 mm. Two sets of such a combination were produced. Thereafter, the produced slide glasses were brought into close contact such that two PET sheets were opposed spacing with a predetermined interval, with a capacitor separator paper having a thickness of 40 µm interposed therebetween. In this process, the ion gel precursor was impregnated into the capacitor separator paper. Then, an ion gel-impregnated paper having a thickness of 40 µm was obtained by heating in a thermoregulated bath at 100° C. for 30 min, and thereafter cooling to a room temperature. Since the adhesive property between the PET sheet and the ion gel-impregnated paper to each other is very poor, they could be readily detached. Hereinafter, the ion gel hereby obtained is referred to as "electrolyte ion gel".

Adhesion of Electrolyte Ion Gel-Electrically Conductive Polymer Membrane

A three-layer structure of "electrically conductive polymer membrane/electrolyte ion gel/electrically conductive polymer membrane" was formed by overlaying the electrically conductive polymer membrane on both faces of the electrolyte ion gel so as to allow the faces in which PVP had been embedded in the state being dispersed were opposed, heating in a thermoregulated bath at 100° C. for 30 min, and thereafter cooling to a room temperature. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

The bending displacement magnitude was evaluated by triangulation measurement using a laser displacement meter. The measurement point of the triangulation measurement was positioned mm away in the lengthwise direction from the point where the electrode was mounted.

When a voltage of ±1.0 V was applied to this actuator, the bending motion was effected in response to the applied voltage without causing detachment at the electrolyte ion gel-electrically conductive polymer membrane boundary surface. The displacement magnitude observed upon driving with a rectangular pulse of 1 Hz is shown in Table 1.

TABLE 1

|  | Number of driving times (time) | | | | | |
| --- | --- | --- | --- | --- | --- | --- |
|  | 1 | 60 | 120 | 600 | 1800 | 5400 |
| Example 1 Displacement magnitude (mm) | 0.47 | 0.45 | 0.45 | 0.45 | 0.41 | 0.40 |

From Table 1, it is suggested that the bendable electrically conductive polymer actuator having this constitution is superior in adhesive properties of the electrically conductive polymer membrane and the solid electrolyte membrane, and can be operated for a long period of time.

Example 2

Production of Electrically Conductive Polymer Membrane in which Second Organic Polymer is Embedded in the State Being Dispersed On a silicon substrate subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT with which 5% by weight of N-methylpyrrolidone (NMP) was mixed. Before this membrane was dried, polyvinylphenol (PVP) was sprayed on the surface in an amount of 0.1% by weight of the aqueous dispersion liquid of the mixture of PSS and PEDOT. Thereafter, the solvent was volatilized by air drying at a room temperature, whereby an electrically conductive polymer membrane was formed on the silicon substrate, in which PVP was embedded in the state being dispersed.

Finally, the silicon substrate was immersed in 50% by volume of an aqueous potassium hydroxide solution to detach the electrically conductive polymer membrane from the substrate. Thus obtained electrically conductive polymer membrane had a mean thickness of 8 µm, and had an electric conductivity of 251 S/cm as determined with a four-probe method.

Preparation of Material of Ion Gel

In the ionic liquid for producing the ion gel, butylmethyl imidazolium (BMI) was used as a cation, while hexafluorophosphoric acid anion ($PF_6^-$) was used as an anion. As the polymer to be mixed, a vinylidene fluoride/hexafluoropropylene copolymer [P(VDF/HFP)] was used. The mixing ratio of EMITFSI to P(VDF/HFP) was 8:2 by weight ratio, and after mixing, the liquid was sufficiently stirred using a magnetic stirrer. Hereinafter, this mixed liquid is designated as ion gel precursor.

Production of Electrolyte Ion Gel

A polyethylene terephthalate (PET) sheet having a thickness of 0.1 mm was cut into a size of 76 mm×26 mm, and this piece was brought into close contact with a slide glass having a size of 76 mm×26 mm. Two sets of such a combination were produced. Thereafter, the produced slide glasses were brought into close contact such that two PET sheets were opposed spacing with a predetermined interval, with a capacitor separator paper having a thickness of 40 µm interposed therebetween. In this process, the ion gel precursor was impregnated into the capacitor separator paper. Then, an ion gel-impregnated paper having a thickness of 40 µm was obtained by heating in a thermoregulated bath at 100° C. for 30 min, and thereafter cooling to a room temperature. Since the adhesive property between the PET sheet and the ion gel-impregnated paper to each other is very poor, they could be readily detached. Hereinafter, the ion gel-impregnated paper hereby obtained is referred to as "electrolyte ion gel".

Lamination of Electrolyte Ion Gel-Electrically Conductive Polymer Membrane

A three-layer structure of "electrically conductive polymer membrane/electrolyte ion gel/electrically conductive polymer membrane" was formed by overlaying the electrically conductive polymer membrane on both faces of the electrolyte ion gel so as to allow them to be opposed, heating in a thermoregulated bath at 100° C. for 30 min, and thereafter cooling to a room temperature. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

When a voltage of ±1.0 V was applied to this actuator, the bending motion was effected in response to the applied voltage without causing detachment at the electrolyte ion gel-electrically conductive polymer membrane boundary surface. The displacement magnitude observed upon driving with a rectangular pulse of 1 Hz is shown in Table 2.

TABLE 2

|  | Number of driving times (time) | | | | | |
| --- | --- | --- | --- | --- | --- | --- |
|  | 1 | 60 | 120 | 600 | 1800 | 5400 |
| Example 2 Displacement magnitude (mm) | 0.51 | 0.47 | 0.46 | 0.45 | 0.41 | 0.38 |

From Table 2, it is suggested that the bendable electrically conductive polymer actuator having this constitution is superior in adhesive properties of the electrically conductive polymer membrane and the solid electrolyte membrane, and can be operated for a long period of time.

Example 3

A bendable electrically conductive polymer actuator was produced in a similar manner to Example 1 except that polyvinylphenol (PVP) was mixed in an amount of 0.05, 0.1, 1, or 5% by weight. When a voltage of +1.0 V was applied to these actuators, the bending motion was effected in response to the applied voltage without causing detachment at the electrolyte ion gel-electrically conductive polymer membrane boundary surface, and in regard to the displacement magnitude with a rectangular pulse of 1 Hz, the mean displacement magnitude of initial ten times measurements was revealed to be no less than 0.40 mm. Thus, these actuators can provide stable bending motion even though they were continuously driven for a long period of time, similarly to Examples 1 and 2. To the contrary, when the dispersion liquid in which polyvinylphenol (PVP) had been dissolved in an amount of 5% by weight was used, the membrane was so fragile that a bendable electrically conductive polymer actuator could not be produced when a similar manner to that in Example 1 was employed. (Table 3)

Thereafter, the solvent was volatilized by air drying at a room temperature, whereby an electrically conductive polymer membrane was formed on the slide glass. Finally, the electrically conductive polymer membrane was detached from the slide glass using a razor.

A three-layer structure of was formed by overlaying the electrically conductive polymer membrane on both faces of the electrolyte ion gel produced in a similar manner to Example 1, heating in a thermoregulated bath at 100° C. for 30 min, and thereafter cooling to a room temperature, thereby adhering the electrolyte ion gel and the electrically conductive polymer membrane. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm. (Table 3)

Comparative Example 2

On a silicon substrate subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT in which 5% by weight of N-methylpyrrolidone (NMP) was dissolved. Thereafter, the solvent was volatilized by air drying at a room temperature, whereby an electrically conductive polymer membrane was formed on the silicon substrate. Finally, the silicon substrate was immersed in 50% by volume of an aqueous potassium hydroxide solution to detach the electrically conductive polymer membrane from the substrate.

A three-layer structure of was formed by overlaying the electrically conductive polymer membrane on both faces of

TABLE 3

|  | Amount of mixed polybiphenyl (percent by weight) | | | | | |
| --- | --- | --- | --- | --- | --- | --- |
|  | 0 | 0.05 | 0.1 | 0.5 | 1 | 5 |
| Electrically conductive polymer actuator Production and Bending motion | Bending motion failed | no less than 0.40 mm Bending motion effected | no less than 0.40 mm Bending motion effected | no less than 0.40 mm Bending motion effected | no less than 0.40 mm Bending motion effected | Actuator not produced |

Comparative Example 1

On a slide glass subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT in which 5% by weight of dimethyl sulfoxide (DMSO) was dissolved.

the electrolyte ion gel produced in a similar manner to Example 2, heating in a thermoregulated bath at 100° C. for 30 min, and thereafter cooling to a room temperature, thereby adhering the electrically conductive polymer membrane and the electrolyte ion gel and. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm.

Comparative Example 3

On a slide glass subjected to a treatment with oxygen plasma after washing with acetone was added dropwise a predetermined amount of an aqueous dispersion liquid (manufactured by H. C. Starck GmbH, trade name: Baytron® PH500) of a mixture of PSS and PEDOT in which 5% by weight of dimethyl sulfoxide (DMSO) was dissolved. Thereafter, the solvent was volatilized by air drying at a room temperature, whereby an electrically conductive polymer membrane was formed on the slide glass. After the electrically conductive polymer membrane was formed, polyvinylphenol (PVP) was sprayed on the surface. Finally, the electrically conductive polymer membrane was detached from the slide glass using a razor.

A three-layer structure of was formed by overlaying the electrically conductive polymer membrane on both faces of the electrolyte ion gel produced in a similar manner to Example 1, heating in a thermoregulated bath at 100° C. for 30 min, and thereafter cooling to a room temperature, thereby adhering the electrolyte ion gel and the electrically conductive polymer membrane. This three-layer structure was cut to provide a width of 2.5 mm and a length of 15 mm. A platinum electrode having a width of 2 mm and a length of 10 mm was mounted on thus obtained structure at a region 5 mm away in the longitudinal direction from one end. Thus, a bendable electrically conductive polymer actuator having a length of the movable portion being 10 mm was produced.

This actuator exhibited very poor adhesive properties between the electrolyte ion gel and the electrically conductive polymer membrane. Further, when a voltage of ±1.0 V was applied, detachment was caused at the electrolyte ion gel-electrically conductive polymer membrane boundary surface without effecting any bending motion in response to the applied voltage, and in regard to the displacement magnitude with a rectangular pulse of 1 Hz, the mean displacement magnitude of initial ten times measurements was revealed to be no less than 0.05 mm.

From the foregoing description, many modifications and other embodiments of the present invention are apparent to persons skilled in the art. Accordingly, the foregoing description should be construed merely as an illustrative example, which was provided for the purpose of teaching best modes for carrying out the present invention to persons skilled in the art. Details of the construction and/or function of the present invention can be substantially altered without departing from the spirit thereof.

INDUSTRIAL APPLICABILITY

According to the present invention, manufacture of compact and light weight, and highly flexible actuators in a simple manner is enabled, and they can be suitably used in the field of robots for medical care, industry, and household use, as well as micromachines, and the like.

What is claimed is:

1. A bendable electrically conductive polymer actuator comprising:
   a pair of electrodes, and
   a laminating structure sandwiched between the pair of electrodes, wherein
   the laminating structure comprises:
   a solid electrolyte membrane constituted with a mixture including an ionic liquid, and a first organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and
   an electrically conductive polymer membrane which is formed on the solid electrolyte membrane, and which is constituted with a mixture of polyethylenedioxythiophene (PEDOT) and polystyrene sulfonic acid (PSS),
   and wherein
   a second organic polymer constituted with polyvinylphenol (PVP) is embedded in the state being dispersed, in the electrically conductive polymer membrane surface, and
   the solid electrolyte membrane is in contact with the face of the electrically conductive polymer membrane surface in which the second organic polymer is embedded in the state being dispersed.

2. The bendable electrically conductive polymer actuator according to claim 1 wherein the electrically conductive polymer membrane is formed on both faces of the solid electrolyte membrane.

3. A method of driving a bendable electrically conductive polymer actuator, the method comprising the steps of:
   providing the bendable electrically conductive polymer actuator comprising:
   a pair of electrodes, and
   a laminating structure sandwiched between the pair of electrodes, wherein
   the laminating structure comprises:
   a solid electrolyte membrane constituted with a mixture including an ionic liquid, and a first organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and
   an electrically conductive polymer membrane which is formed on the solid electrolyte membrane, and which is constituted with a mixture of polyethylenedioxythiophene (PEDOT) and polystyrene sulfonic acid (PSS),
   and wherein
   a second organic polymer constituted with polyvinylphenol (PVP) is embedded in the state being dispersed, in the electrically conductive polymer membrane surface, and
   the solid electrolyte membrane is in contact with the face of the electrically conductive polymer membrane surface in which the second organic polymer is embedded in the state being dispersed, and applying a voltage to the pair of electrodes.

4. The method of driving a bendable electrically conductive polymer actuator according to claim 3 wherein the electrically conductive polymer membrane is formed on both faces of the solid electrolyte membrane.

5. A method for manufacturing a bendable electrically conductive polymer actuator comprising:
a pair of electrodes, and
a laminating structure sandwiched between the pair of electrodes, wherein
the laminating structure comprises:
a solid electrolyte membrane constituted with a mixture including an ionic liquid, and a first organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and
an electrically conductive polymer membrane which is formed on the solid electrolyte membrane, and which is constituted with a mixture of polyethylenedioxythiophene (PEDOT) and polystyrene sulfonic acid (PSS),
the method comprising the steps of:
coating a dispersion liquid or solution of an electrically conductive polymer on a substrate, and before the dispersion liquid or solution is dried to form a solid film, embedding a second organic polymer constituted with polyvinylphenol (PVP) in the state being dispersed, by means of spraying or coating; and
laminating on at least one face of the solid electrolyte membrane so as to be opposed to the face of the electrically conductive polymer membrane surface in which the second organic polymer is embedded in the state being dispersed.

6. A method for manufacturing a bendable electrically conductive polymer actuator comprising:
a pair of electrodes, and
a laminating structure sandwiched between the pair of electrodes, wherein
the laminating structure comprises:
a solid electrolyte membrane constituted with a mixture including an ionic liquid, and a first organic polymer that contains at least one or more of a vinylidene fluoride/hexafluoropropylene copolymer [P(VDF/HFP)], polyvinylidene fluoride (PVDF), a perfluorosulfonic acid/PTFE copolymer, polymethyl methacrylate (PMMA), polyethylene oxide (PEO) and polyacrylonitrile (PAN); and
an electrically conductive polymer membrane which is formed on the solid electrolyte membrane, and which is constituted with a mixture of polyethylenedioxythiophene (PEDOT) and polystyrene sulfonic acid (PSS),
the method comprising the steps of:
embedding a second organic polymer in the state being dispersed, in an electrically conductive polymer membrane surface by dispersing the second organic polymer, which is constituted with polyvinylphenol (PVP), and which has a specific gravity smaller than that of the electrically conductive polymer dispersion liquid or solution, in the electrically conductive polymer dispersion liquid or solution beforehand; and
laminating on at least one face of the solid electrolyte membrane so as to be opposed to the face of the electrically conductive polymer membrane surface in which the second organic polymer is embedded in the state being dispersed.

* * * * *

UNITED STATES PATENT AND TRADEMARK OFFICE
CERTIFICATE OF CORRECTION

PATENT NO.         : 7,638,930 B1
APPLICATION NO.    : 12/362946
DATED              : December 29, 2009
INVENTOR(S)        : Yuji Kudoh It is certified that error appears in the above-identified patent and that said Letters Patent is hereby corrected as shown below:

On the title page, insert the following after "(22) Filed: Jan. 30, 2009" and before "Related U.S. Application Data.":

--Prior Publication Data

(65) US 2009-0308737-A1, December 17, 2009--

Signed and Sealed this

Thirtieth Day of November, 2010

David J. Kappos
*Director of the United States Patent and Trademark Office*